(12) United States Patent
Sun et al.

(10) Patent No.: US 12,394,730 B2
(45) Date of Patent: Aug. 19, 2025

(54) SEMICONDUCTOR STRUCTURE

(71) Applicant: United Microelectronics Corp., Hsinchu (TW)

(72) Inventors: Chia-Chen Sun, Kaohsiung (TW); En-Chiuan Liou, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 534 days.

(21) Appl. No.: 17/864,407

(22) Filed: Jul. 14, 2022

(65) Prior Publication Data

US 2023/0411308 A1 Dec. 21, 2023

(30) Foreign Application Priority Data

Jun. 21, 2022 (TW) ................... 111122950

(51) Int. Cl.
*H01L 23/528* (2006.01)
*H01L 23/00* (2006.01)
*H01L 23/522* (2006.01)

(52) U.S. Cl.
CPC ........ *H01L 23/562* (2013.01); *H01L 23/5226* (2013.01); *H01L 23/528* (2013.01)

(58) Field of Classification Search
None
See application file for complete search history.

(56) References Cited

U.S. PATENT DOCUMENTS

| | | | |
|---|---|---|---|
| 6,767,826 B2 | 7/2004 | Abe | |
| 7,960,821 B2 | 6/2011 | Chen et al. | |
| 9,111,065 B2 | 8/2015 | Liu et al. | |
| 9,245,822 B2 | 1/2016 | Tsai et al. | |
| 9,269,649 B2 | 2/2016 | Tsai et al. | |
| 2020/0365612 A1 | 11/2020 | Hu et al. | |
| 2020/0411452 A1 | 12/2020 | Lin et al. | |
| 2021/0183813 A1* | 6/2021 | Yeh ..................... H01L 21/6835 |

FOREIGN PATENT DOCUMENTS

TW 201440190 10/2014

OTHER PUBLICATIONS

Machine-generated English translation of TW 201440190 (Year: 2014).*
"Office Action of Taiwan Counterpart Application", issued on Nov. 18, 2024, p. 1-p. 4.

* cited by examiner

*Primary Examiner* — Bo B Jang
(74) *Attorney, Agent, or Firm* — JCIPRNET (57) ABSTRACT

Provided is a semiconductor structure including a first and a second conductive layers, and a first group of vias. The second conductive layer is disposed on the first conductive layer. The first group of vias is disposed between and connects the first and the second conductive layer. The first group of vias includes a first, a second, a third and a fourth vias. The first and second vias are arranged in a first column. The third and fourth vias are arranged in a second column. The first via is adjacent to the third via. The second via is adjacent to the fourth via. The extension directions of the first and second vias are orthogonal to each other, the extension directions of the third and the fourth vias are orthogonal to each other, and the extending directions of the first and the third vias are orthogonal to each other.

15 Claims, 7 Drawing Sheets

SEMICONDUCTOR STRUCTURE

CROSS-REFERENCE TO RELATED APPLICATION

This application claims the priority benefit of Taiwan application serial no. 111122950, filed on Jun. 21, 2022. The entirety of the above-mentioned patent application is hereby incorporated by reference herein and made a part of this specification.

BACKGROUND

Technical Field

The present invention relates to a semiconductor structure, and particularly to a semiconductor structure which may avoid dishing of the conductive layer after chemical mechanical polishing (CMP) process.

Description of Related Art

With the improvement of the operating speed of the semiconductor apparatus, the integration degree of the devices in the semiconductor apparatus is needed to increase. Therefore, multiple conductive layers are disposed in the semiconductor apparatus to provide a circuit layout with higher density. In the manufacturing process of the semiconductor apparatus, a chemical mechanical polishing process is performed to improve the flatness of a film. However, for a region with lower device density, the conductive layer may be dished due to uneven stress during the chemical mechanical polishing process. In particular, for stacked conductive layers, dishing is more likely to occur after the chemical mechanical polishing process. As a result, the electrical properties of the semiconductor apparatus may be seriously affected.

SUMMARY

The present invention provides a semiconductor structure, wherein a group of vias with a specific configuration are disposed between two adjacent conductive layers.

A semiconductor structure of the present invention includes a first conductive layer, a second conductive layer and a first group of vias. The first conductive layer is disposed on a substrate. The second conductive layer is disposed on the first conductive layer. The first group of vias is disposed between the first conductive layer and the second conductive layer, and connects the first conductive layer and the second conductive layer. The first group of vias includes a first via, a second via, a third via and a fourth via. The first via and the second via are arranged in a first column. The third via and the fourth via are arranged in a second column. The first via is adjacent to the third via, and the second via is adjacent to the fourth via. From the top view of the substrate, the extension direction of the first via is orthogonal to the extension direction of the second via, the extension direction of the third via is orthogonal to the extension direction of the fourth via, and the extending direction of the first via is orthogonal to the extending direction of the third via.

In an embodiment of the semiconductor structure of the present invention, projection shapes of the first via, the second via, the third via and the fourth via on a plane of the first conductive layer are the same.

In an embodiment of the semiconductor structure of the present invention, each of the projected shapes is a rectangle.

In an embodiment of the semiconductor structure of the present invention, a length ratio of a short side to a long side of each of the projected shapes is between 1:2 and 1:3.

In an embodiment of the semiconductor structure of the present invention, each of the projected shapes is an ellipse.

In an embodiment of the semiconductor structure of the present invention, a length ratio of the minor axis to the major axis of each of the projected shapes is between 1:2 and 1:3.

In an embodiment of the semiconductor structure of the present invention, a projected shape of the first conductive layer on a plane of the substrate is a square, and the first via, the second via, the third via and the fourth via are respectively located at four corners of the square.

In an embodiment of the semiconductor structure of the present invention, the first via comprises a plurality of first sub-vias arranged in parallel, the second via comprises a plurality of second sub-vias arranged in parallel, the third via comprises a plurality of third sub-vias arranged in parallel, the fourth via comprises a plurality of fourth sub-vias arranged in parallel, and the number of the plurality of first sub-vias, the number of the plurality of second sub-vias, the number of the plurality of third sub-vias and the number of the plurality of fourth sub-vias are the same.

In an embodiment of the semiconductor structure of the present invention, each via in the first group of vias is a dummy via.

In an embodiment of the semiconductor structure of the present invention, the semiconductor structure comprises a plurality of the first group of vias disposed between the first conductive layer and the second conductive layer and connecting the first conductive layer and the second conductive layer.

In an embodiment of the semiconductor structure of the present invention, a third conductive layer and a second group of vias are further included, wherein the third conductive layer is disposed on the second conductive layer, the second group of vias is disposed between the second conductive layer and the third conductive layer and connects the second conductive layer and the third conductive layer, and the second group of vias and the first group of vias have the same or similar configuration.

In an embodiment of the semiconductor structure of the present invention, the first group of vias and the second group of vias are aligned with each other in a direction orthogonal to a plane of the first conductive layer.

In an embodiment of the semiconductor structure of the present invention, the first group of vias and the second group of vias are not aligned with other in a direction orthogonal to a plane of the first conductive layer.

In an embodiment of the semiconductor structure of the present invention, the semiconductor structure comprises a plurality of the second group of vias disposed between the second conductive layer and the third conductive layer and connecting the second conductive layer and the third conductive layer.

In an embodiment of the semiconductor structure of the present invention, each via in the second group of vias is a dummy via.

Based on the above, in the semiconductor structure of the present invention, a group of vias with the above configuration are disposed between two adjacent conductive layers, so that the stress may be more uniform during the chemical mechanical polishing process to avoid the dishing of the conductive layers after the chemical mechanical polishing process.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the present invention. In addition, the drawings are for illustrative purposes only and are not drawn to the original dimensions. For the sake of easy understanding, the same elements in the following description will be denoted by the same reference numerals.

In the text, the terms mentioned in the text, such as "comprising", "including", "containing" and "having" are all open-ended terms, i.e., meaning "including but not limited to".

When using terms such as "first" and "second" to describe elements, it is only used to distinguish the elements from each other, and does not limit the order or importance of the devices. Therefore, in some cases, the first element may also be called the second element, the second element may also be called the first element, and this is not beyond the scope of the present invention.

In addition, the directional terms, such as "on", "above", "under" and "below" mentioned in the text are only used to refer to the direction of the drawings, and are not used to limit the present invention.

Further, in the text, the range represented by "a value to another value" is a summary expression way to avoid listing all the values in the range one by one in the specification. Therefore, the record of a specific numerical range covers any numerical value within the numerical range, as well as a smaller numerical range defined by any numerical value within the numerical range.

Figure 1A:
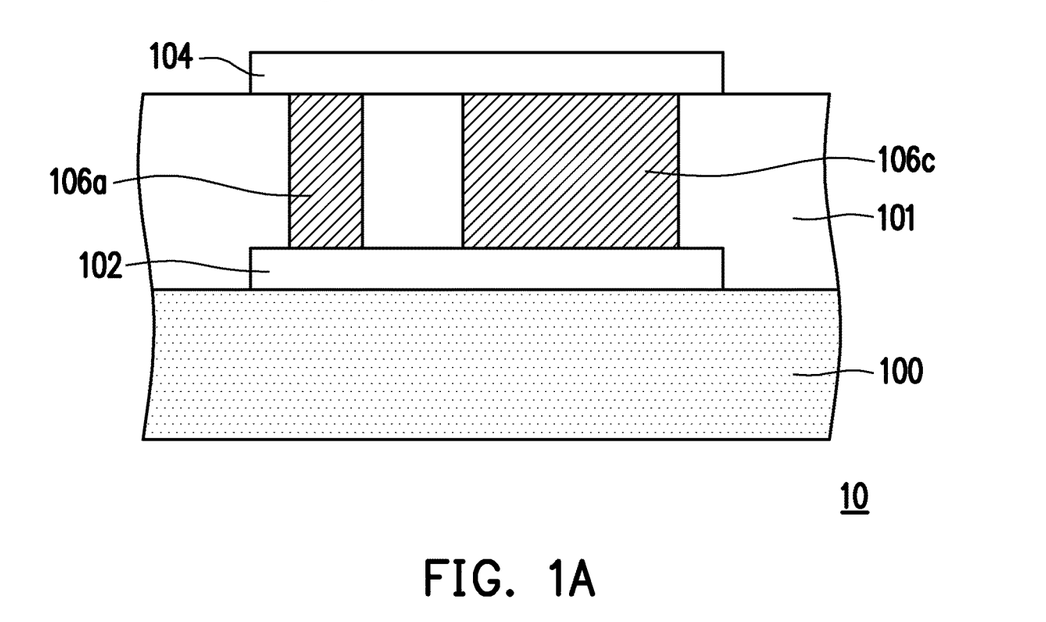
FIG. 1A is a schematic cross-sectional view of a semiconductor structure of an embodiment of the present invention.
Figure 1B:
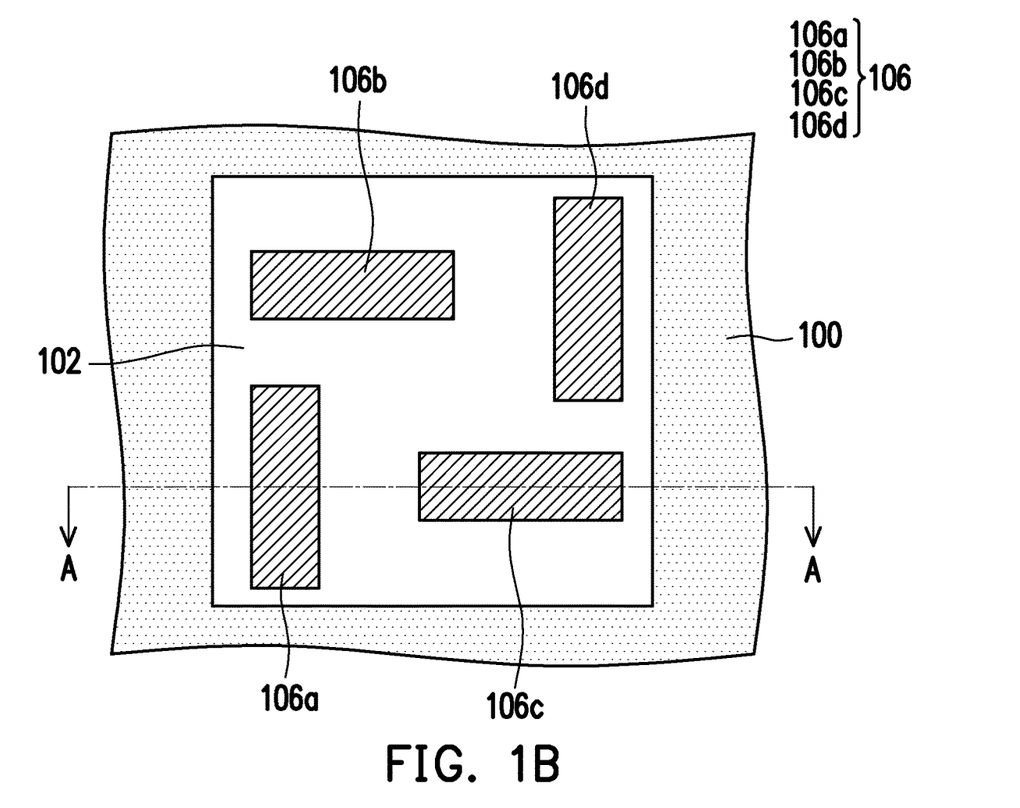
FIG. 1B is a schematic top view of the semiconductor structure of FIG. 1A, wherein a second conductive layer and a dielectric layer in the semiconductor structure are omitted.

FIG. 1A is a schematic cross-sectional view of a semiconductor structure of an embodiment of the present invention. FIG. 1B is a schematic top view of the semiconductor structure of FIG. 1A, and FIG. 1A is a schematic cross-sectional view along the section line A-A in FIG. 1B. In FIG. 1B, a second conductive layer and a first dielectric layer in the semiconductor structure are omitted for the sake of clarity and convenience of description.

Referring to FIGS. 1A and 1B, in the present embodiment, the semiconductor structure 10 includes a substrate 100, a first dielectric layer 101, a first conductive layer 102, a second conductive layer 104 and a first group of vias 106. In the present embodiment, the substrate 100 is a dielectric substrate. The substrate 100 is, for example, a dielectric layer formed on a silicon substrate or a silicon-on-insulator (SOI) substrate. The first conductive layer 102 is disposed on the substrate 100. The first conductive layer 102 is, for example, a metal layer. The second conductive layer 104 is disposed on the first conductive layer 102. The second conductive layer 104 is, for example, a metal layer. The first dielectric layer 101 is disposed between the first conductive layer 102 and the second conductive layer 104, and covers the first conductive layer 102. The first conductive layer 102 and the second conductive layer 104 may be circuit layers in a device region of the substrate 100, or may be dummy layers in a peripheral region of the substrate 100, which is not limited in the present invention. In a case where the first conductive layer 102 and the second conductive layer 104 are used as circuit layers in the device region, the first conductive layer 102 may be electrically connected with the second conductive layer 104. In a case where the first conductive layer 102 and the second conductive layer 104 are used as dummy layers in the peripheral region, the first conductive layer 102 may be electrically separated from the second conductive layer 104, or the first conductive layer 102 and the second conductive layer 104 may be floating. In the present embodiment, the projected shape of the first conductive layer 102 on the plane of the substrate 100 may be a square, a rectangle or other polygons, which is not limited in the present invention. The projected shape of the first conductive layer 102 on the plane of the substrate 100 is preferably a square.

The first group of vias 106 is disposed in the first dielectric layer 101 between the first conductive layer 102 and the second conductive layer 104, and connect the first conductive layer 102 and the second conductive layer 104. In a case where the first conductive layer 102 and the second conductive layer 104 are used as circuit layers in the device region, the first group of vias 106 may be used as the conductive vias for electrically connecting the first conductive layer 102 and the second conductive layer 104. In a case where the first conductive layer 102 and the second conductive layer 104 are used as dummy layers in the peripheral region, the first group of vias 106 is only used as dummy vias for connecting the first conductive layer 102 and the second conductive layer 104, without transmitting electrical signals.

Figure 2:
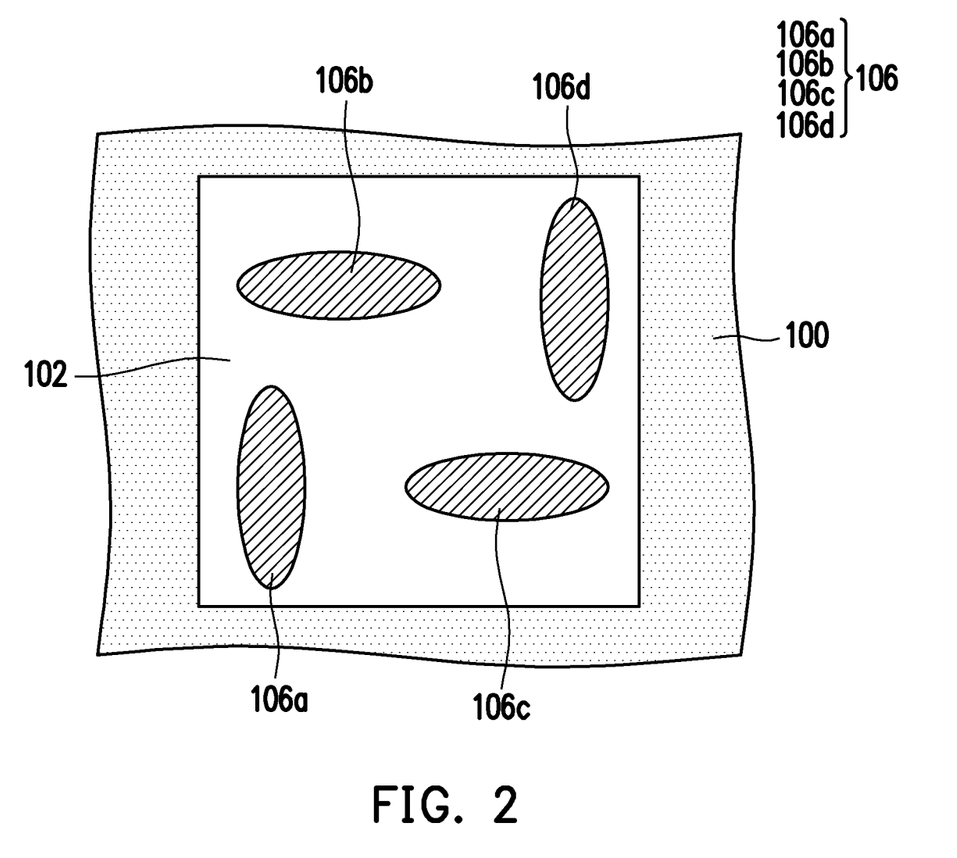
FIG. 2 is a schematic top view of a semiconductor structure of another embodiment of the present invention, wherein a second conductive layer and a dielectric layer in the semiconductor structure are omitted.

In the present embodiment, as shown in FIG. 1B, the first group of vias 106 includes a first via 106a, a second via 106b, a third via 106c and a fourth via 106d. From the top view of the substrate 100, the first via 106a and the second via 106b are arranged in a first column, and the third via 106c and the fourth via 106d are arranged in a second column. In the present embodiment, each of the projected shapes of the first via 106a, the second via 106b, the third via 106c and the fourth via 106d on the plane of the first conductive layer 102 is a rectangle, and the length ratio of the short side to the long side of the rectangle may be between 1:2 and 1:3, but present invention is not limited thereto. In other embodiment, each of the projected shapes of the first via 106a, the second via 106b, the third via 106c and the fourth via 106d on the plane of the first conductive layer 102 may be an ellipse (as shown in FIG. 2), and the length ratio of the minor axis to the major axis of the ellipse may be between 1:2 and 1:3.

Furthermore, the first via 106a is adjacent to the third via 106c, and the second via 106b is adjacent to the fourth via 106d. The extension direction of the first via 106a is orthogonal to the extension direction of the second via 106b, the extension direction of the third via 106c is orthogonal to the extension direction of the fourth via 106d, and the extension direction of the first via 106a is orthogonal to the extension direction of the third via 106c. That is, in the present embodiment, on the plane of the substrate 100 or the first conductive layer 102, four vias are approximately arranged in a "fan" style. As a result, during the chemical mechanical polishing process, since the first group of vias 106 is disposed between the first conductive layer 102 and the second conductive layer 104 and the first group of vias 106 is arranged in the above manner, the stress may be uniform during the chemical mechanical polishing process, thereby the dishing of the first conductive layer 102 and/or the second conductive layer 104 after the chemical mechanical polishing process may be avoided.

In addition, in order to make the stress more uniform during the chemical mechanical polishing process, the layout of the first group of vias 106 may be adjusted according to the actual situation. For example, as in the present embodiment, the projected shape of the first conductive layer 102 on the plane of the substrate 100 is a square, and the first via 106a, the second via 106b, the third via 106c and the fourth via 106d are each located at four corners of the square. Or, as in the present embodiment, the projection shapes of the first via 106a, the second via 106b, the third via 106c and the fourth via 106d on the plane of the first conductive layer 102 are the same. The above various layouts for the first group of vias 106 may effectively make the stress during the chemical mechanical polishing process uniform, so as to avoid the dishing of the first conductive layer 102 and/or the second conductive layer 104 after the chemical mechanical polishing process.

Figure 3:
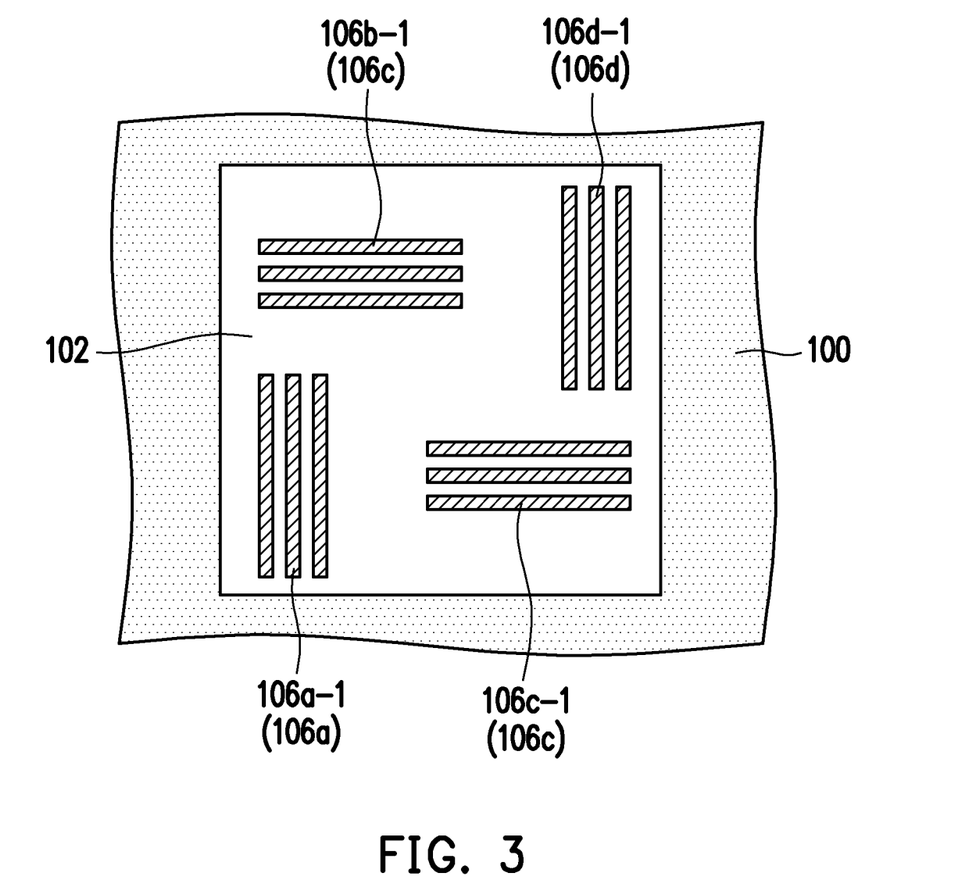
FIG. 3 is a schematic top view of a semiconductor structure of another embodiment of the present invention, wherein a second conductive layer and a dielectric layer in the semiconductor structure are omitted.

In addition, each of the vias may include a plurality of sub-vias, depending on actual needs. As shown in FIG. 3, in the present embodiment, the first via 106a includes a plurality of first sub-vias 106a-1 arranged in parallel, the second via 106b includes a plurality of second sub-vias 106b-1 arranged in parallel, and the third via 106c includes a plurality of third sub-vias 106c-1 arranged in parallel, and the fourth via 106d includes a plurality of fourth sub-vias 106d-1 arranged in parallel. In the present embodiment, each of the vias includes 3 sub-vias, but the present invention is not limited thereto. In addition, in other embodiments, the number of sub-vias included in each via may be different. In a case where the number of first sub-vias 106a-1, second sub-vias 106b-1, third sub-vias 106c-1 and fourth sub-vias 106d-1 are the same, the stress during the process of chemical mechanical polishing may be more uniform to avoid the dishing of the first conductive layer 102 and/or the second conductive layer 104 after the chemical mechanical polishing process.

Figure 4:
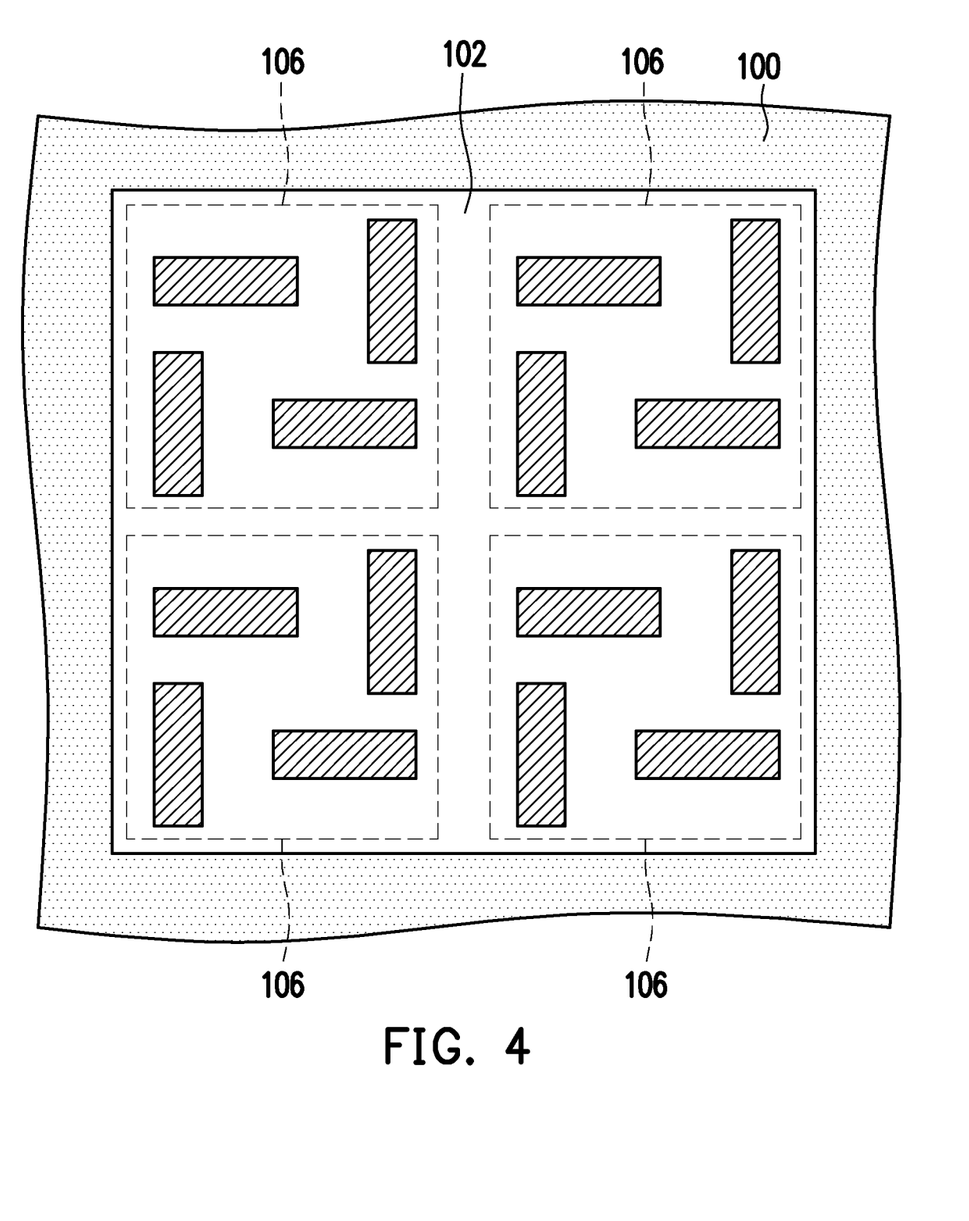
FIG. 4 is a schematic top view of a semiconductor structure of another embodiment of the present invention, wherein a second conductive layer and a dielectric layer in the semiconductor structure are omitted.

In each of the above embodiments, only one group of vias 106 is disposed between the first conductive layer 102 and the second conductive layer 104, but the present invention is not limited thereto. In other embodiment, multiple groups of vias may be disposed between the first conductive layer 102 and the second conductive layer 104. As shown in FIG. 4, in the present embodiment, four groups of the first group of vias 106 are disposed between the first conductive layer 102 and the second conductive layer 104, and the four groups of the first group of vias 106 have the same configuration, but the present invention is not limited thereto. In other embodiments, these groups of the first group of vias 106 may have different configurations. In addition, the number and the arrangement of these groups of the first group of vias 106 may not be limited in the present invention.

Figure 5A:
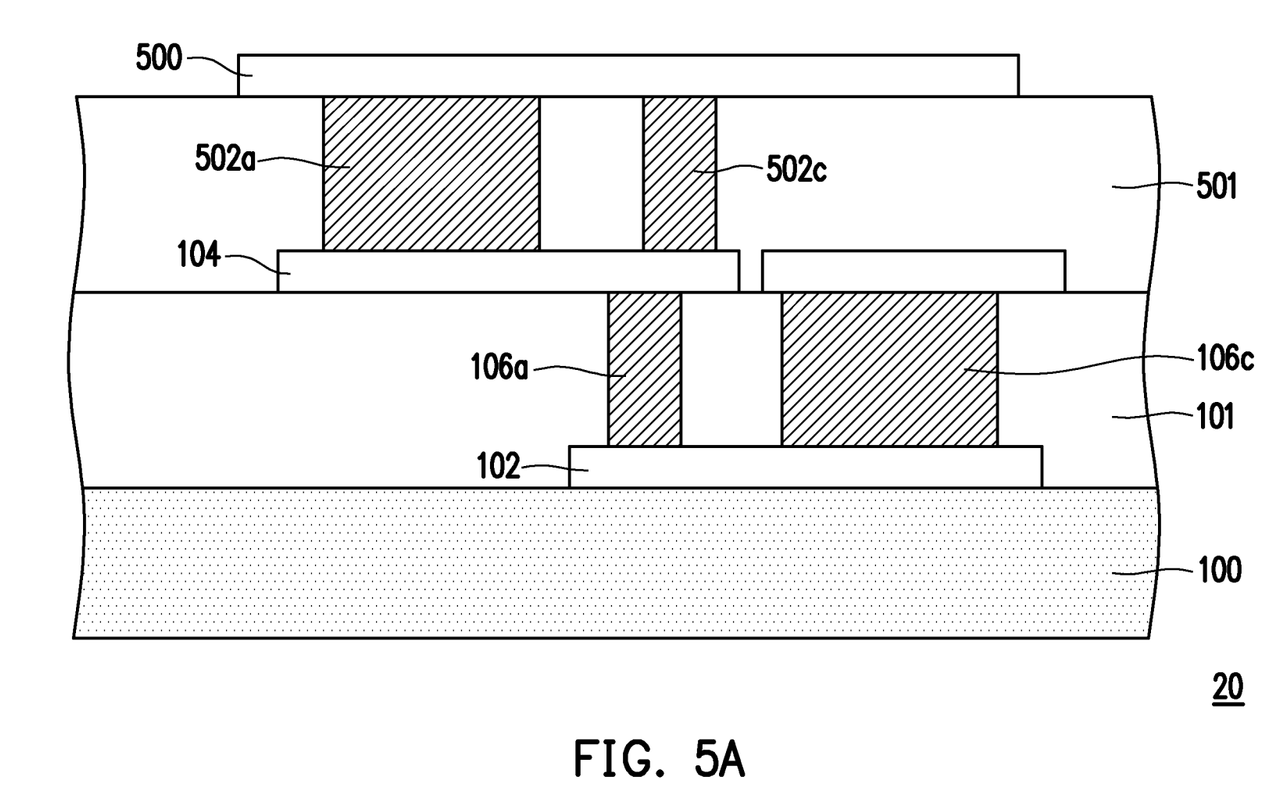
FIG. 5A is a schematic cross-sectional view of a semiconductor structure of another embodiment of the present invention.
Figure 5B:
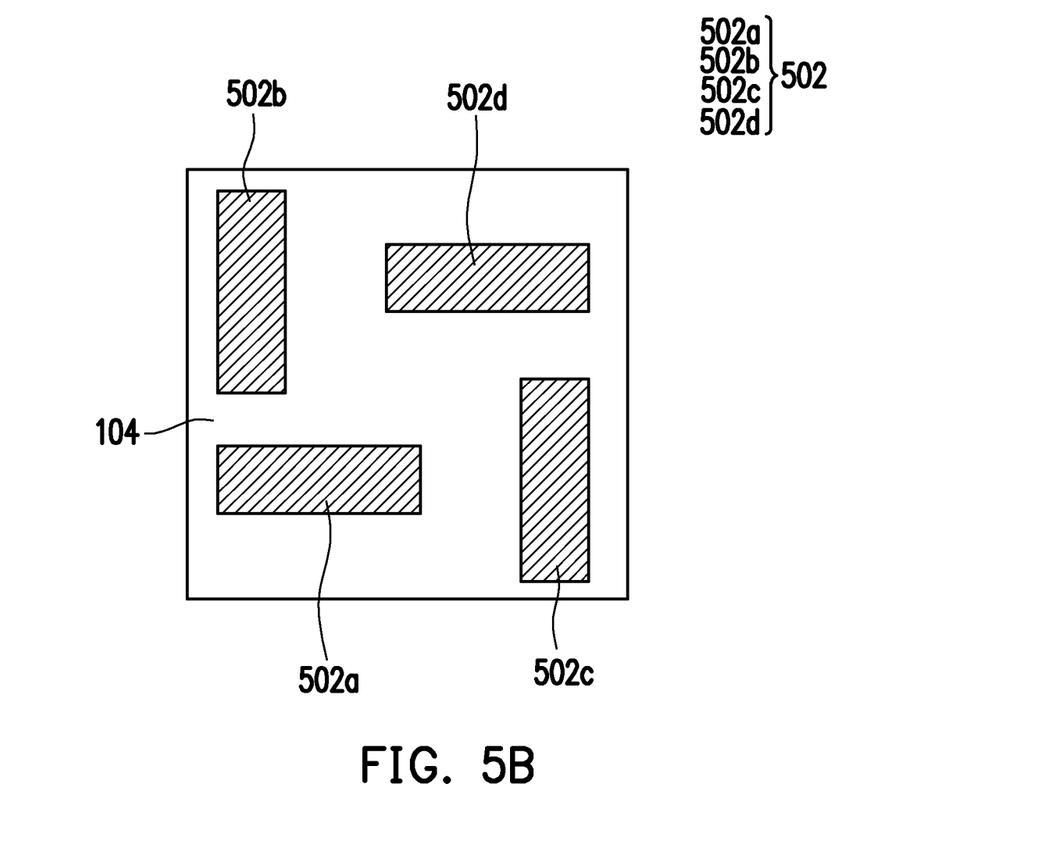
FIG. 5B is a schematic top view of a second conductive layer and a second group of vias in FIG. 5A.

FIG. 5A is a schematic cross-sectional view of a semiconductor structure of another embodiment of the present invention. FIG. 5B is a schematic top view of a second conductive layer and a second group of vias in FIG. 5A. In the present embodiment, the same device as in FIGS. 1A and 1B will be represented by the same reference number, and will not be described again.

Referring to FIGS. 5A and 5B, in the present embodiment, the semiconductor structure 20 includes the substrate 100, the first dielectric layer 101, the first conductive layer 102, the second conductive layer 104, the first group of vias 106, a third conductive layer 500, a second dielectric layer 501 and a second group of vias 502. The third conductive layer 500 is disposed on the second conductive layer 102. The third conductive layer 500 is, for example, a metal layer. The second dielectric layer 501 is disposed between the second conductive layer 104 and the third conductive layer 500 and covers the second conductive layer 104. The second group of vias 502 is disposed in the second dielectric layer 501 between the second conductive layer 104 and the third conductive layer 500, and connects the second conductive layer 104 and the third conductive layer 500.

The configurations and the functions of the second conductive layer 104 and the second group of vias 502 may be the same as or similar to those of the first conductive layer 102 and the first group of vias 106. As shown in FIG. 5B, the second group of vias 502 includes a first via 502a, a second via 502b, a third via 502c and a fourth via 502d. From the top view of the substrate 100, the first via 502a and the second via 502b are arranged in a first column, and the third via 502c and the fourth via 502d are arranged in a second column. The first via 502a is adjacent to the third via 502c, and the second via 502b is adjacent to the fourth via 502d. The extension direction of the first via 502a is orthogonal to the extension direction of the second via 502b, the extension direction of the third via 502c is orthogonal to the extension direction of the fourth via 502d, and the extension direction of the first via 502a is orthogonal to the extension direction of the third via 502c.

In the present embodiment, the semiconductor structure 20 includes three stacked conductive layers, and a group of vias are disposed between two adjacent conductive layers. In this way, when the chemical mechanical polishing process is performed, the stress may be uniform during the chemical mechanical polishing process, preventing the first conductive layer 102, the second conductive layer 104 and/or the third conductive layer 500 from dishing after the chemical mechanical polishing process. In addition, when the semiconductor structure includes more conductive layers, the dishing may be avoided after the chemical mechanical polishing process by disposing at least one group of vias between two adjacent conductive layers.

Figure 6:
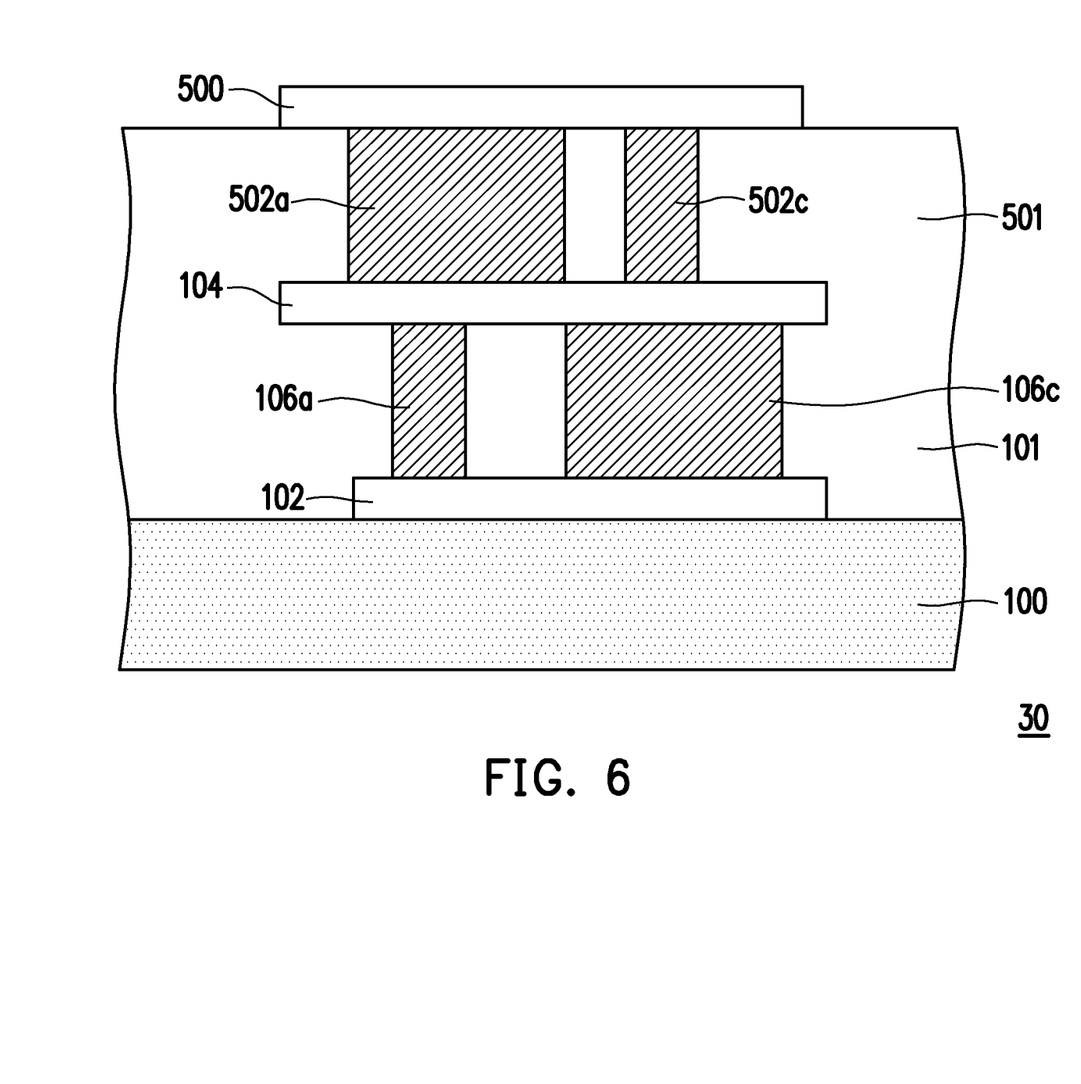
FIG. 6 is a schematic cross-sectional view of a semiconductor structure of another embodiment of the present invention.

In the present embodiment, the first group of vias 106 and the second group of vias 502 are not aligned with each other in a direction orthogonal to the plane of the first conductive layer 102, but the present invention is not limited thereto. In other embodiments, the first group of vias 106 and the second group of vias 502 may be aligned with each other in the direction orthogonal to the plane of the first conductive layer 102, as shown in the semiconductor structure of FIG. 6. In addition, in some embodiments, multiple groups of the second group of vias 502 may be disposed between the second conductive layer 104 and the third conductive layer 500, as shown in FIG. 4.

It will be apparent to those skilled in the art that various modifications and variations may be made to the disclosed embodiments without departing from the scope or spirit of the invention. In view of the foregoing, it is intended that the invention covers modifications and variations provided that they fall within the scope of the following claims and their equivalents.

What is claimed is:

1. A semiconductor structure, comprising:
   a first conductive layer, disposed on a substrate;
   a second conductive layer, disposed on the first conductive layer; and
   a first group of vias, disposed between the first conductive layer and the second conductive layer, and connecting the first conductive layer and the second conductive layer,
   wherein the first group of vias comprises a first via, a second via, a third via and a fourth via, the first via and the second via are arranged in a first column, and the third via and the fourth via are arranged in a second column;
   the first via is adjacent to the third via, and the second via is adjacent to the fourth via;
   the first via and the third via are arranged in a first row, and the second via and the fourth via are arranged in a second row,
   the first via, the second via, the third via and the fourth via are separated from each other, and
   from a top view of the substrate, an extension direction of the first via is orthogonal to an extension direction of the second via, an extension direction of the third via is orthogonal to an extension direction of the fourth via, and the extension direction of the first via is orthogonal to the extension direction of the third via.

2. The semiconductor structure of claim 1, wherein projection shapes of the first via, the second via, the third via and the fourth via on a plane of the first conductive layer are the same.

3. The semiconductor structure of claim 2, wherein each of the projected shapes is a rectangle.

4. The semiconductor structure of claim 3, wherein a length ratio of a short side to a long side of each of the projected shapes is between 1:2 and 1:3.

5. The semiconductor structure of claim 2, wherein each of the projected shapes is an ellipse.

6. The semiconductor structure of claim 5, wherein a length ratio of a minor axis to a major axis of each of the projected shapes is between 1:2 and 1:3.

7. The semiconductor structure of claim 1, wherein a projected shape of the first conductive layer on a plane of the substrate is a square, and the first via, the second via, the third via and the fourth via are respectively located at four corners of the square.

8. The semiconductor structure of claim 1, wherein the first via comprises a plurality of first sub-vias arranged in parallel, the second via comprises a plurality of second sub-vias arranged in parallel, the third via comprises a plurality of third sub-vias arranged in parallel, the fourth via comprises a plurality of fourth sub-vias arranged in parallel, and the number of the plurality of first sub-vias, the number of the plurality of second sub-vias, the number of the plurality of third sub-vias and the number of the plurality of fourth sub-vias are the same.

9. The semiconductor structure of claim 1, wherein each via in the first group of vias is a dummy via which does not transmit electrical signals.

10. The semiconductor structure of claim 1, wherein the semiconductor structure comprises a plurality of the first group of vias disposed between the first conductive layer and the second conductive layer and connecting the first conductive layer and the second conductive layer.

11. The semiconductor structure of claim 1, further comprising a third conductive layer and a second group of vias, wherein the third conductive layer is disposed on the second conductive layer, the second group of vias is disposed between the second conductive layer and the third conductive layer and connects the second conductive layer and the third conductive layer, and the second group of vias and the first group of vias have the same or similar configuration.

12. The semiconductor structure of claim 11, wherein the first group of vias and the second group of vias are aligned with each other in a direction orthogonal to a plane of the first conductive layer.

13. The semiconductor structure of claim 11, wherein the first group of vias and the second group of vias are not aligned with each other in a direction orthogonal to a plane of the first conductive layer.

14. The semiconductor structure of claim 11, wherein the semiconductor structure comprises a plurality of the second group of vias disposed between the second conductive layer and the third conductive layer and connecting the second conductive layer and the third conductive layer.

15. The semiconductor structure of claim 11, wherein each via in the second group of vias is a dummy via which does not transmit electrical signals.

* * * * *